(12) United States Patent
Meckes et al.

(10) Patent No.: US 7,061,098 B2
(45) Date of Patent: Jun. 13, 2006

(54) ELECTRONIC COMPONENT AND METHOD FOR ITS PRODUCTION

(75) Inventors: Andreas Meckes, Munich (DE); Horst Theuss, Wenzenbach (DE); Michael Weber, Mainburg (DE)

(73) Assignee: Infineon Technologies AG, Munich (DE)

( * ) Notice: Subject to any disclaimer, the term of this patent is extended or adjusted under 35 U.S.C. 154(b) by 105 days.

(21) Appl. No.: 10/723,998

(22) Filed: Nov. 26, 2003

(65) Prior Publication Data
US 2004/0161909 A1   Aug. 19, 2004

(30) Foreign Application Priority Data
Nov. 29, 2002   (DE) .............................. 102 56 116

(51) Int. Cl.
*H01L 23/12* (2006.01)
(52) U.S. Cl. ...................... 257/704; 257/701
(58) Field of Classification Search ............... 257/701, 257/678, 704
See application file for complete search history.

(56) References Cited

U.S. PATENT DOCUMENTS

| | | | |
|---|---|---|---|
| 4,744,863 A | 5/1988 | Guckel et al. | |
| 5,090,254 A | 2/1992 | Guckel et al. | |
| 5,454,906 A | 10/1995 | Baker et al. | |
| 5,872,493 A | 2/1999 | Ella | |
| 6,114,635 A | 9/2000 | Lakin et al. | |
| 6,232,150 B1 | 5/2001 | Lin et al. | |
| 6,550,664 B1 | 4/2003 | Bradley et al. | |
| 2001/0001293 A1 | 5/2001 | Gotoh et al. | |
| 2001/0004085 A1 | 6/2001 | Gueissaz | |
| 2005/0189621 A1* | 9/2005 | Cheung ...................... 257/619 |

FOREIGN PATENT DOCUMENTS

DE   101 05 351 A 1   8/2002

OTHER PUBLICATIONS

Mei et al., "Process Characterization and Analysis of Sealed Vacuum Microelectric Devices," J. Vac. Sci. Techn. B 12(2), Mar./Apr. 1994, pp. 638-643.
Hakan Ederstig, Per Wallgren, "Spin Desposition of Polymers over Holes and Cavities," Sensors and Actuators A46-47, 1995, pp. 95-97.

* cited by examiner

*Primary Examiner*—Bradley K. Smith
(74) *Attorney, Agent, or Firm*—Dicke, Billig & Czaja, PLLC

(57) ABSTRACT

An electronic component includes a semiconductor die which exhibits on its active top side above an active surface area a self-supporting electrically conductive cover layer which is supported by through lines and forms a hollow space to the active surface area. A method for producing the electronic component includes additional features.

14 Claims, 4 Drawing Sheets

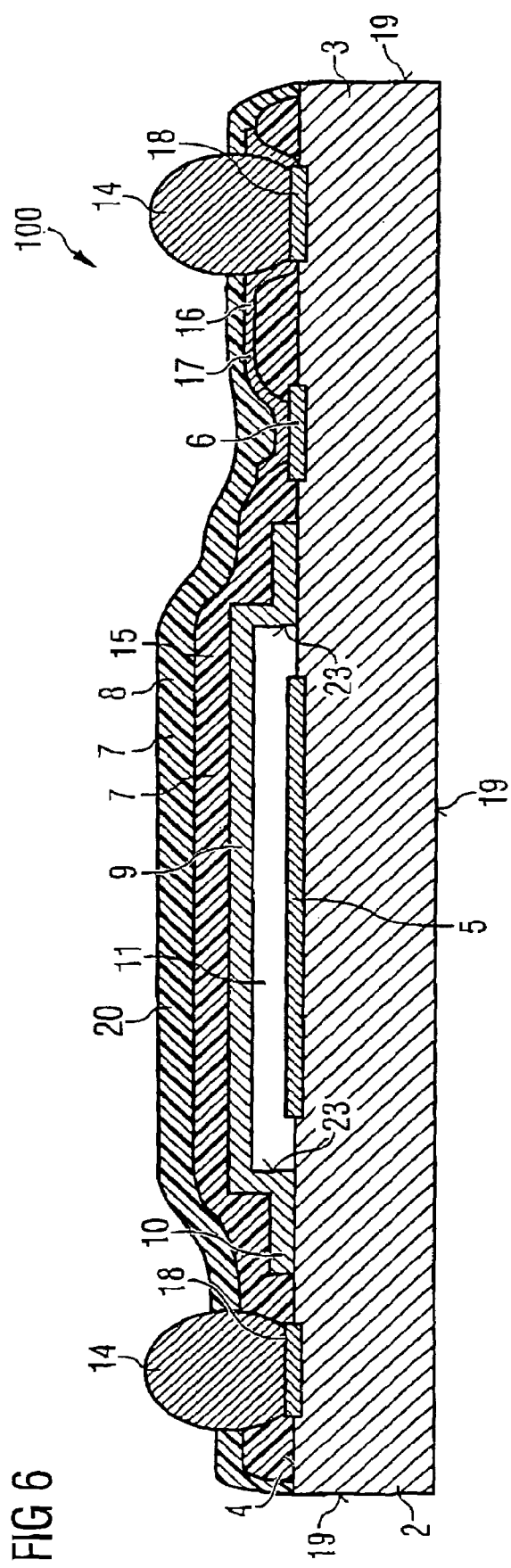

ELECTRONIC COMPONENT AND METHOD FOR ITS PRODUCTION

CROSS-REFERENCE TO RELATED APPLICATION

The subject matter of this application is related to the subject matter of German Patent Application No. DE 102 56 116.8, filed Nov. 29, 2002, priority to which is claimed under 35 U.S.C. § 119 and which is incorporated herein by reference.

BACKGROUND

Embodiments of the invention relate to an electronic component with a semiconductor substrate for a micro-electromechanical system, an active top side on the semiconductor substrate having an active surface area which is covered by a self-supporting electrically conductive covering element. Furthermore, embodiments of the invention relate to a semiconductor wafer having a number of such components and to a method for producing such an electronic component or semiconductor wafer, respectively.

Furthermore, embodiments of the present invention concern radio frequency (RF) filters and pertains particularly to mounting film bulk acoustic wave filters (BAW filters) in microwave packages using "wafer-level-package" technology. BAW filter die are placed within hermetically sealed packages which are known e.g. from the U.S. Pat. No. 5,872,493, incorporated herein by reference.

BAW filters can be fabricated to include various known types of BAW resonators. These known types of BAW resonators comprise three basic portions. A first one of the portions, which is used to generate acoustic waves, includes an acoustically-active piezoelectric layer. This layer may comprise, by example, zinc-oxide (ZnO), aluminum nitride (AlN), zinc-sulfur (ZnS), or any other suitable piezoelectric material that can be fabricated as a thin film. A second one of the portions includes electrodes that are formed on opposite sides of the piezoelectric layer. A third portion of the BAW resonator includes a mechanism for acoustically isolating the substrate from vibrations produced by the piezoelectric layer. BAW resonators are typically fabricated on silicon, gallium arsenide, or glass substrates using thin film technology (e.g., sputtering, chemical vapor deposition, etc.). BAW resonators exhibit series and parallel resonances that are similar to those of, by example, crystal resonators. Resonant frequencies of BAW resonators can typically range from about 0.5 GH to 5 GHz, depending on the layer thicknesses of the devices.

For applications such as cellular phones, it is desirable to reduce the size of components. Particularly, it is desirable to integrate RF duplexers and filters as part of a radio-on-a-die with a manufacturable technology.

SUMMARY OF THE INVENTION

It is an object of embodiments of the invention to specify an electronic component, especially an BAW filter component, which increases the degree of miniaturization in covering, shielding and/or resonant structures and which can be produced inexpensively.

An electronic component according to an embodiment of the invention exhibits a semiconductor die with a semiconductor substrate. On the semiconductor substrate, an active top side is arranged. On the active top side, an active surface area is located. This active surface area is a part of a micro-electromechanical system. This active surface area is connected to contact connecting areas on the active top side of the semiconductor substrate.

The package of the electric component exhibits a package-forming plastic layer which covers the substrate, leaving the contact connecting areas exposed. Between the package-forming plastic layer and the active top side of the semiconductor substrate, a self-supporting electrically conductive cover layer is arranged above the active surface area. This cover layer is supported by through lines to the active top side and forms a hollow space which extends between the active surface area and cover layer.

The height of the hollow space corresponds to a thickness of an insulation layer, metal layer or photoresist layer, which is normal for semiconductor wafers and which can be applied as sacrificial layer on a semiconductor wafer. The hollow space can thus exhibit a height in the submicrometer range up to a few micrometers. In this context, the submicrometer range means a thickness between about 100 nm and about 1 µm. A few micrometers means a thickness between about 1 µm and about 20 µm.

Due to the low height of the hollow space, not only is the degree of miniaturization of microelectromechanical systems increased but the interaction between the cover and the active components, arranged underneath it, of the active surface area is intensified. This makes it possible to produce more effective BAW filter components.

In addition, an electronic component according to an embodiment of the invention makes it possible to achieve a very flat and small type of construction which makes it possible to integrate such components into RF modules for RF filter systems in the mobile telephone field, particularly with semiconductor die containing a filter circuit, the filter circuit being implemented using film bulk acoustic resonators.

To supply and remove signals to the active surface area and for applying supply voltages to the self-supporting electrically conductive cover layer, the electronic component has contact connecting areas which are connected both to the active surface area and to the cover layer via conductor tracks, the contact connecting areas in one embodiment of the invention carrying external contacts of the electronic component.

Furthermore, the package-forming plastic layer, leaving the contact connecting areas or the external contacts, respectively, exposed, can cover the cover layer in such a manner that the hollow space underneath the cover layer is laterally sealed between the load-bearing through lines. This results in a hermetically sealed hollow space which, after being covered by the package-forming plastic layer, is subjected to a reference pressure.

To hold the self-supporting cover layer at a minimum distance above the active surface area, the load-bearing through lines are arranged regularly distributed around the circumference of the cover layer. Such through lines can carry cover layers of several edge length of about 100 µm and are distributed at an interval of about 10 µm to about 50 µm around the circumference of the cover layer.

As electrically conductive material, the cover layer exhibits a metal or a semiconductor material. For this purpose, the semiconductor material is heavily doped. The semiconductor material used is optionally polycrystalline silicon with a dopant concentration of more than $10^{19}/cm^3$. The metal of the cover layer is nickel, copper, aluminum or alloys thereof, silicon being used as alloying addition in order to increase the stiffness of the metals.

Electronic components according to embodiments of the invention can be arranged in rows and columns on semiconductor wafers which has the advantage that all components of the electronic components from the external contacts to the self-supporting cover layers can be provided in parallel and at the same time on the semiconductor wafer. A further aspect of the invention relates to a use in which the electronic components are arranged in rows and columns with microelectromechanical patterns. The use differs from the semiconductor wafer in that the semiconductor dies are arranged in a plastic compound or on a corresponding circuit board distributed at a predetermined distance on a larger area than in the case of the semiconductor wafer. An advantage of such a use is that the size and number of external contacts can be arbitrarily increased since between the semiconductor dies, larger plastic areas or larger circuit board surfaces are available for arranging the external contacts of the electronic components.

A method according to an embodiment of the invention for producing a semiconductor wafer with a number of semiconductor dies for a number of electronic components has the following features. Firstly, a semiconductor wafer having a number of semiconductor die positions arranged in rows and columns is provided. Then active surface areas are created on the active top side of the semiconductor wafer in the semiconductor die positions and outside these active surface areas, contact areas are applied to the active top side of the semiconductor wafer. Following this, a sacrificial layer is applied and patterned. After the patterning, the sacrificial layer covers the active surface area and exhibits through openings in the edge areas of the active surface area which extend to the active top side of the semiconductor substrate in the form of a semiconductor wafer.

As the sacrificial layer, oxides, nitrides or photoresists can be applied and patterned. Following this, a conductive material which, at the same time, forms through lines, connected to the cover layer, in the through openings, is applied to the sacrificial layer. These through lines are distributed around the circumference of the cover layer. This makes it possible to remove the sacrificial layer between the through lines and under the cover layer. During this process, a cover layer which is supported by through lines and is self-supporting is created above the active surface area, forming a flat hollow space.

Next, a plastic layer is applied as packaging to the cover layer and the active top side, leaving the contact connecting areas exposed. At the same time, this first plastic layer seals the side edges of the hollow space and thus closes the gaps between the supporting and load-bearing through lines. Since, when the first plastic layer is applied or the first plastic layer is patterned thereafter, the contact connecting areas are left exposed, external contacts for the electronic components can already be applied to the contact connecting areas on the whole semiconductor wafer. Thus, these external contacts are applied simultaneously on one and the same semiconductor wafer for many electronic components. Thereafter, the semiconductor wafer can be split into individual electronic components.

This method has the advantage that covering, shielding and/or resonant structures for individual electronic components do not need to be assembled and produced separately and individually but that they can be implemented in parallel on a semiconductor wafer. In addition, the method has the advantage that the dimensions of such covering, shielding and/or resonant structures can reach a higher degree of miniaturization as a result of which, on the one hand, higher operating frequencies and, on the other hand, greater interactions between covering, shielding and/or resonant layer and active surface areas arranged underneath in a hollow space can be achieved.

The patterned sacrificial layer applied in the method can be deposited on the semiconductor wafer from a chemical gas phase, forming silicon oxide or silicon nitride. Another variant includes applying a sacrificial metal layer, the etching rate of which differs significantly from an etching rate of the patterned conductive cover layer applied so that the sacrificial layer can be etched out more rapidly than the cover layer is removed. For this purpose, reactive plasma etching methods are used. Another possibility of forming a sacrificial layer includes applying a photoresist layer on the semiconductor wafer by spinning or spraying it on and patterning it with the aid of photolithography.

The material of the sacrificial layer can depend on the possibilities of deposition and application for the self-supporting electrically conductive cover layer. If a polycrystalline silicon is deposited from an organometallic compound in the chemical gas phase method, a sacrificial layer of silicon oxide or silicon nitride is provided which can be removed subsequently by means of hydrofluoric acid in the case of the silicon oxide. When a metallic cover layer of e.g. nickel, copper, aluminum or alloys thereof is applied, a photoresist can be applied to the semiconductor wafer. A sacrificial layer of photoresist can be subsequently removed by means of solvents which protects the surfaces of the active surface area and the metallic cover layers. A cover layer of nickel or nickel alloys enables a sacrificial layer of copper or of a copper alloy to be used since copper etchants can be used which have a negligible effect on the cover layer of nickel or nickel alloys.

In a further variant of the performance of a method according to an embodiment of the invention, a rewiring pattern is then applied to the first plastic layer for sealing the side edges of the cover layer and for packaging the active surface of the semiconductor wafer. The rewiring pattern and the first plastic layer are covered with a second plastic layer as package-forming layer, leaving the external contact areas exposed.

The rewiring pattern on the first plastic layer is used for connecting the contact connecting areas via rewiring lines to correspondingly larger external contact areas on the first plastic layer or prepared through openings in the first plastic layer. The second plastic layer then covers the entire first plastic layer with the rewiring pattern and only leaves an access to the external contact areas exposed. Thus, external contacts can be applied to the external contact areas for the entire semiconductor wafer. Both the first plastic layer and the second plastic layer can consist of epoxy resin. However, it is advantageous to use as the second plastic layer polyamide which, at the same time, is used as solder resist layer for applying the external contacts.

In summary, it must be noted that a cavity package according to an embodiment of the invention is distinguished by the fact that all processes for generating the semiconductor die, the hollow space, the electric rewiring and the electric contacting can already be performed at wafer level. Thus, this is a so-called "wafer level package", which can be achieved with very small constructional size for the abovementioned applications which have a hollow space above an active die area. A method for producing microelectromechanical structures requiring such a hollow space lies in the fact that no multi-layer substrate is required for rewiring and no back-end process is needed for creating the hollow space.

By means of the introduction of a micromachining process for creating the hollow space at wafer level, etching out a sacrificial layer and sealing remaining openings by applying an additional polymer layer, it is possible to combine this structure with electrical contacts, also at wafer level. In addition, it is also possible to implement a rewiring plane at wafer level so that the abovementioned advantages such as small component size, microscopically small hollow spaces above active areas and possibilities for adapting external contact areas via rewiring planes to predetermined package sizes are possible. At the same time, processing at wafer level results in low production costs.

The inexpensive possibility exists to implement the first plastic layer for sealing the sides of the hollow spaces by applying polymer foils or by laminating and spraying-on polymer layers. Applying external contacts can be done by applying solder balls. In addition, it is possible to arrange rewiring lines on the first plastic layer above the area of the cover layer or the lid of the hollow space since the first plastic layer can be used at the same time as insulator for the rewiring lines.

BRIEF DESCRIPTION OF THE DRAWINGS

Embodiments of the invention will now be explained in greater detail with reference to the attached figures.

FIG. 6 shows a diagrammatic cross section through an electronic component, according to an embodiment of the invention.

DETAILED DESCRIPTION

Figure 1:
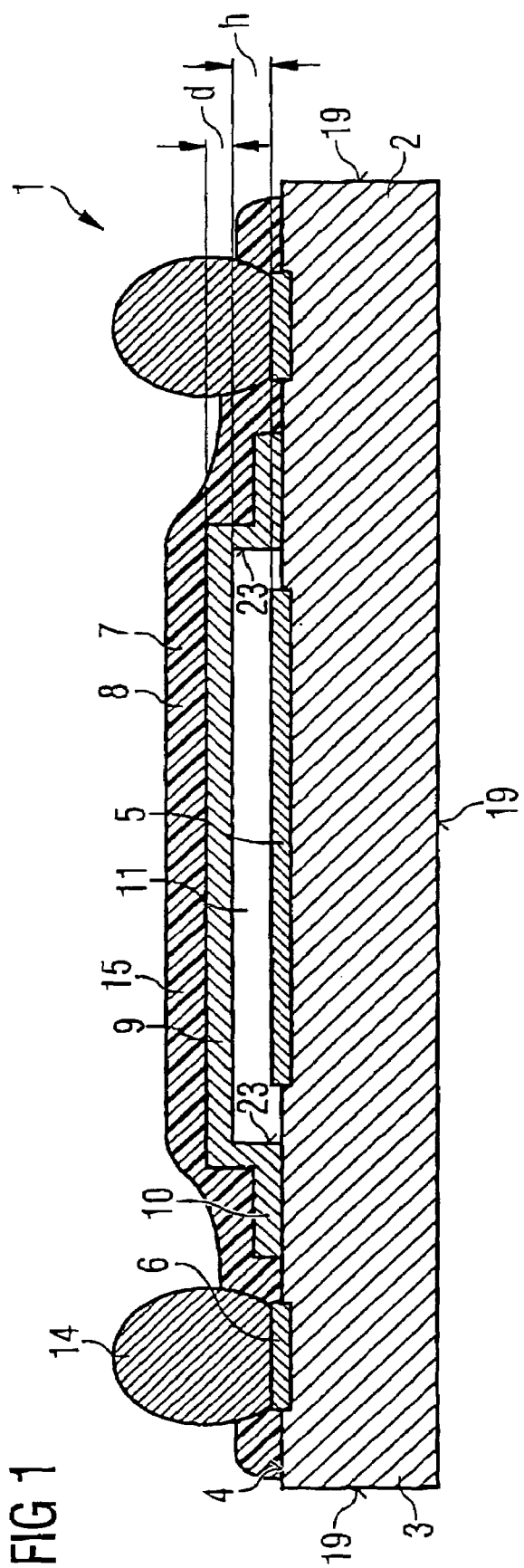
FIG. 1 shows a diagrammatic cross section through an electronic component, according to an embodiment of the invention.

FIG. 1 shows a diagrammatic cross section through an electronic component 1 of a first embodiment of the invention. The electronic component 1 has a semiconductor die 2 with a semiconductor substrate 3 on which an active top side 4 with an active surface area 5 is arranged. On the active top side 4, outside the active surface area 5, contact connecting areas 6 are arranged which are electrically connected to the active surface area 5 via conductor tracks, not shown.

A package 7 exhibits a package-forming plastic layer 8 which covers the active top side 4 of the semiconductor die 2. The remaining outsides of the electronic component 1 are formed by outside surfaces 19 of the semiconductor substrate in the first embodiment according to FIG. 1. The package-forming plastic layer 8 does not cover the contact connecting areas 6 on which external contacts 14 are arranged according to FIG. 1. Above the active surface area 4 of the semiconductor substrate 3, a self-supporting electrically conductive cover layer 9 is arranged.

The cover layer 9 forms a protecting, shielding or resonance structure for the active surface area 5 arranged on the active top side 4. The self-supporting cover layer 9 is connected to through lines 10 which extend to the active top side 4. Between the active surface area 5 and the cover layer 9, a hollow space 11 extends, the height h of which corresponds to the thickness of an insulating layer, a metal layer or a photoresist layer on a semiconductor wafer, in this case within the range of between about 0.3 µm and about 3 µm. Larger hollow spaces, not shown here, having a height of up to about 20 µm are achieved by means of thicker sacrificial layers such as an electroplated copper layer. The self-supporting cover layer 9 has a thickness which corresponds to a thickness of conductor tracks on a semiconductor wafer or on a circuit board, approximately within the range of from about 0.3 µm to about 10 µm.

To produce such an electronic component 1, a semiconductor wafer having a number of semiconductor die positions arranged in rows and columns is first provided. A section of such a semiconductor wafer 13 can be seen in FIG. 2.

Figure 2:
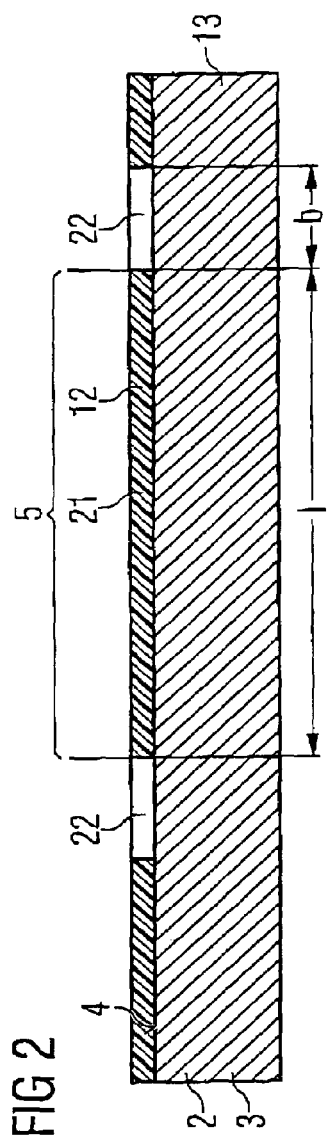
FIG. 2 shows a diagrammatic cross section through a semiconductor wafer in the area of an active surface area to be covered, with a patterned sacrificial layer, according to an embodiment of the invention.

FIG. 2 shows a diagrammatic cross section through a semiconductor wafer 13 in the area of an active surface area 5, which is to be covered, with a patterned sacrificial layer 21. In FIG. 2, the generation of an active surface area 5 for a MEM (micro-electromechanical) structure is thus already concluded and a patterned sacrificial layer 21 is applied above the active surface area 5. This patterned sacrificial layer 21 on the active top side 4 of the semiconductor wafer 13 has through openings 22 in the edge area of the active surface area 5. The sacrificial layer 21 itself is a silicon dioxide layer with a thickness of about 1.2 µm in this exemplary embodiment of a method according to the invention. The edge length l of the active surface area 5 is about 75 µm and the width b of the openings 22 is about 15 µm in this embodiment of the invention.

Figure 3:
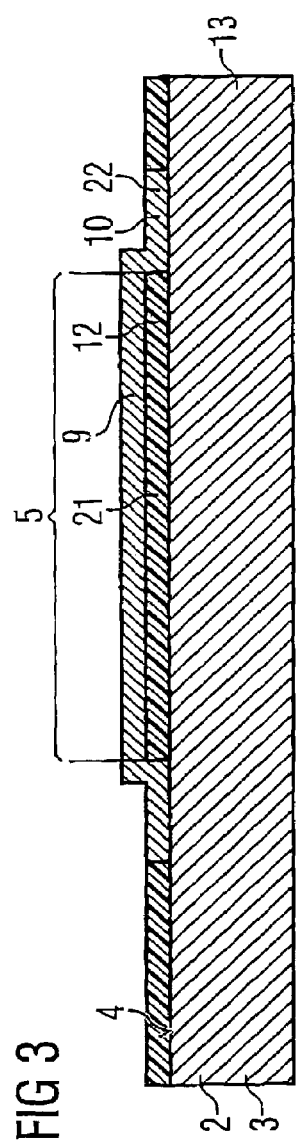
FIG. 3 shows a diagrammatic cross section through a semiconductor wafer according to FIG. 2 after a patterned electrically conductive cover layer has been applied to the sacrificial layer, according to an embodiment of the invention.

FIG. 3 shows the semiconductor wafer 13 according to FIG. 2 after a patterned electrically conductive cover layer 9 has been applied to the sacrificial layer 21. The cover layer 9 also fills up the openings 22 in the sacrificial layer 21 so that the through lines 10 produced in the through openings 22 will later support the cover layer 9. In this example of performance of the method, the cover layer 9 was formed in an organometallic gas phase reactor in which a heavily doped polycrystalline silicon with a thickness of between about 0.3 µm and about 10 µm is deposited on the sacrificial layer 21 and in the openings 22. After the patterning of the deposited polycrystalline silicon layer, the diagrammatic cross-section according to FIG. 3 is obtained.

Figure 4:
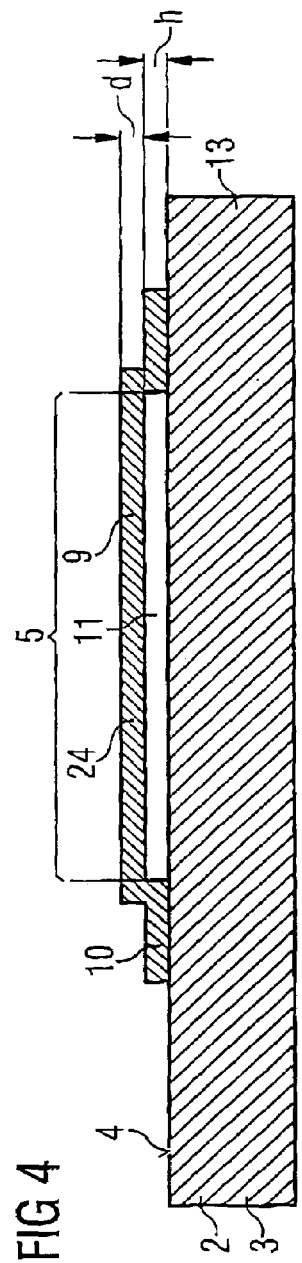
FIG. 4 shows a diagrammatic cross section through a semiconductor wafer according to FIG. 3, after the sacrificial layer has been removed, according to an embodiment of the invention.

FIG. 4 shows the semiconductor wafer 13 according to FIG. 3 after removal of the sacrificial layer 21. The sacrificial layer of silicon oxide is removed by means of buffered hydrofluoric acid which does not attack the heavily doped polycrystalline silicon. After the sacrificial layer has been etched out, the self-supporting metallically conductive cover layer 9 remains above the active surface area 5 on the active top side 4 of the semiconductor wafer 13, forming a hollow space 11.

Between the filled-up openings 22 according to FIG. 3, gaps 25 are produced during the etching through which the hydrofluoric acid can also penetrate below the cover layer 9. Due to the high affinity of the hydrofluoric acid to silicon dioxide, the entire silicon dioxide layer can be etched off under the cover 9 of polycrystalline silicon. In addition, the dimensional stability and stiffness of the polycrystalline silicon ensures that the cover layer 9 becomes a cover which is supported in a self-supporting manner on the lateral through lines 10. Due to the gaps 25 between the through lines 10, the hollow space 11 produced is not hermetically sealed and not protected against environmental influences. This protection is achieved by a first plastic layer, not shown here, which is subsequently deposited.

Figure 5:
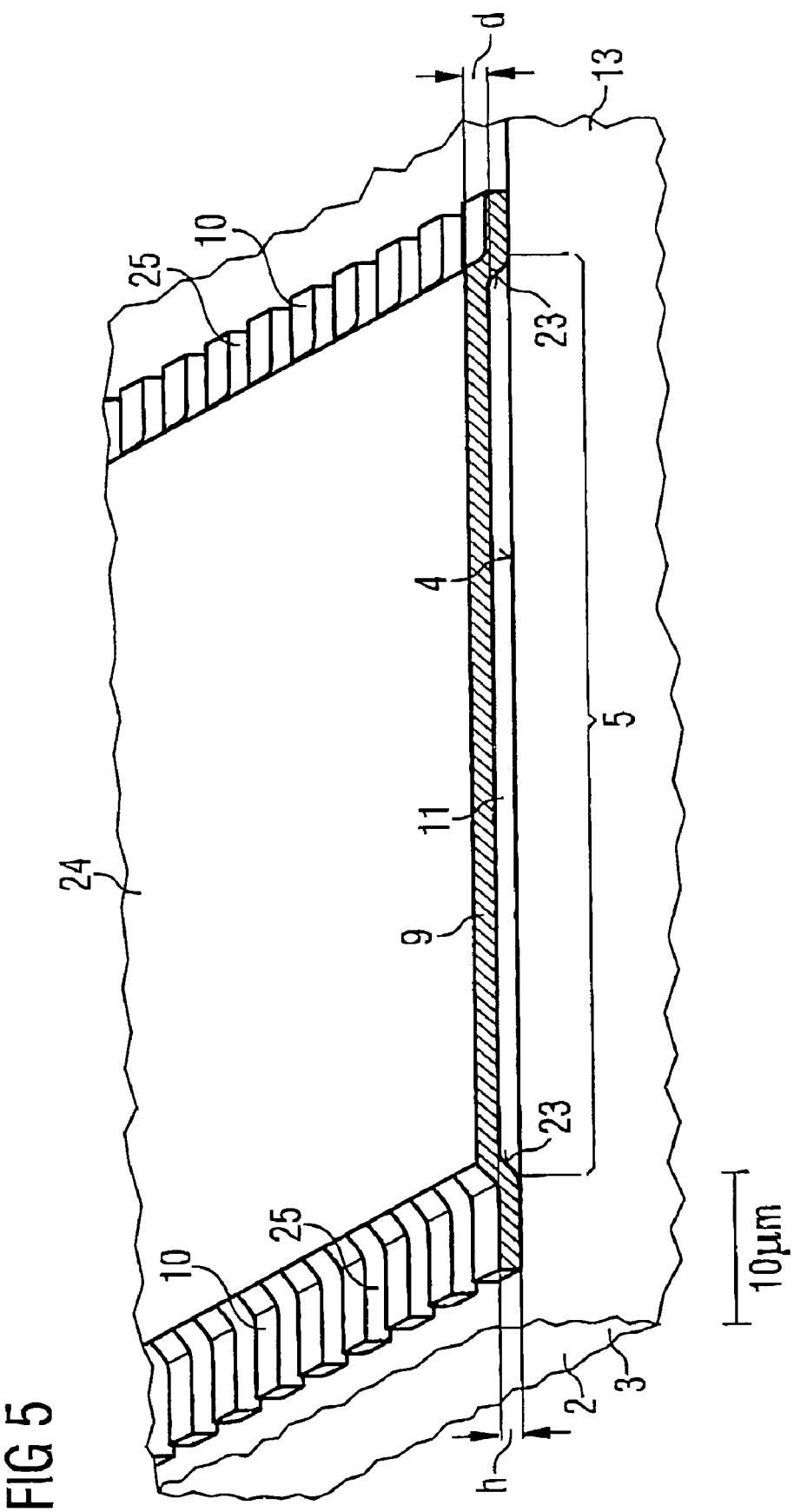
FIG. 5 shows a diagrammatic perspective view of a section of a semiconductor wafer with a cover on an active surface area, according to an embodiment of the invention.

FIG. 5 shows a diagrammatic perspective view of a section of the semiconductor wafer 13 from FIG. 4. The cover 24 is self-supporting and covers the active surface area 5 by forming a hollow space 11. The self-supporting cover 24 is supported to the top and to the side by the through lines 10 which are of the same material as the cover 24. Between the supports in the form of through lines 10, the gaps 25 are arranged.

FIG. 6 shows a diagrammatic cross section through an electronic component 100 according to a second embodiment of the invention. Components having the same functions as in FIG. 1 are identified by the same reference symbols and are not separately explained.

A difference between the first embodiment according to FIG. 1 and the second embodiment according to FIG. 6 occurs in that enlarged external contact areas 18 are arranged next to contact connecting areas 6 on the active top side 4 of the semiconductor die 2. Whereas the contact areas 6 are connected to the active surface area 5 via conductor tracks, not shown here, the external contact areas 18 carry additional enlarged external contacts 14. For this purpose, a rewiring pattern 16 with rewiring lines 17 is applied to the first plastic layer 15, the rewiring lines 17 electrically connecting the contact connecting areas 6 to the external contact areas 18. As protection, and to insulate the rewiring pattern 17, a further second package-forming plastic layer 20 is applied to the first plastic layer 15, leaving the external contact areas 18 exposed.

In the cross section according to FIG. 6, it cannot be seen that the rewiring lines 16 extend on the first plastic layer 15. As a result, the insulated surface produced in the area of the cover is utilized for the wiring. The external contacts 14 themselves here have the form of solder balls. The second plastic layer 20 is simultaneously used as solder resist layer when the external contacts 14 are soldered to the external contact areas 18.

It will be appreciated by persons skilled in the art that the above embodiments have been described by way of example only and not in any limitative sense. Various alternatives and modifications are possible without departure from the scope of the invention.

What is claimed is:

1. An electronic component comprising a semiconductor die, the semiconductor die comprising:
   a semiconductor substrate,
   an active top side on the semiconductor substrate,
   an active surface area on the active top side,
   contact connecting areas electrically connected to the active surface area,
   a package comprising a package-forming plastic layer which covers the substrate leaving the contact connecting areas exposed, and
   a self-supporting electrically conductive cover layer which is arranged above the active surface area and which is supported on through lines to the active top side and forms a hollow space between the active surface area and cover layer,
   wherein the height of the hollow space corresponds to the thickness of an insulation layer, photoresist layer or metal layer for a semiconductor wafer.

2. The electronic component as claimed in claim 1, wherein the cover layer has a thickness which corresponds to a thickness of conductor tracks on a semiconductor wafer.

3. The electronic component as claimed in claim 1, wherein the contact connecting areas are arranged outside the active surface area and comprise external contacts of the electronic component.

4. The electronic component as claimed in claim 1, wherein the package-forming plastic layer covers the cover layer, leaving the contact connecting areas exposed, and seals the hollow space on the side between the through lines.

5. The electronic component as claimed in claim 1, further comprising a first plastic layer on which a rewiring pattern with rewiring lines is arranged which lead from the contact connecting areas to external contact areas, external contacts being arranged on the external contact areas, and a second plastic layer is arranged on the first plastic layer, leaving the external contacts exposed and embedding the rewiring pattern.

6. The electronic component as claimed in claim 5, wherein the through lines are arranged regularly distributed around the circumference of the cover layer.

7. The electronic component as claimed in claim 1, wherein the through lines are arranged regularly distributed around the circumference of the cover layer.

8. The electronic component as claimed in claim 1, wherein the cover layer comprises a metal or a semiconductor material.

9. The electronic component as claimed in claim 8, wherein the cover layer comprises heavily doped polycrystalline silicon.

10. The electronic component as claimed in claim 1, wherein the semiconductor die contains a filter circuit, the filter circuit being implemented using film bulk acoustic resonators.

11. A semiconductor wafer comprising electronic components arranged in rows and columns, each electronic component comprising a semiconductor die, the semiconductor die comprising:
    a semiconductor substrate,
    an active top side on the semiconductor substrate,
    an active surface area on the active top side,
    contact connecting areas electrically connected to the active surface area,
    a package comprising a package-forming plastic layer which covers the substrate leaving the contact connecting areas exposed, and
    a self-supporting electrically conductive cover layer which is arranged above the active surface area and which is supported on through lines to the active top side and forms a hollow space between the active surface area and cover layer,
    wherein the height of the hollow space corresponds to the thickness of an insulation layer, photoresist layer or metal layer for a semiconductor wafer.

12. A semiconductor wafer as claimed in claim 11 further comprising conductor tracks, the cover layer having a thickness which corresponds to the thickness of the conductor tracks.

13. A semiconductor wafer as claimed in claim 11, wherein the contact connecting areas are arranged outside the active surface area and comprise external contacts of the electronic component.

14. A semiconductor wafer as claimed in claim 11, further comprising a first plastic layer on which a rewiring pattern with rewiring lines is arranged which lead from the contact connecting areas to external contact areas, external contacts being arranged on the external contact areas, and a second plastic layer is arranged on the first plastic layer, leaving the external contacts exposed and embedding the rewiring pattern.

* * * * *